(12) United States Patent
Chiatti et al.

(10) Patent No.: US 11,990,015 B2
(45) Date of Patent: May 21, 2024

(54) POINT HEAT DETECTORS BASED ON SURFACE MOUNTED THERMISTORS

(71) Applicant: Honeywell International Inc., Charlotte, NC (US)

(72) Inventors: Andrea Chiatti, Trieste (IT); Andrea Frison, Monfalcone (IT); Arturo Paderno, Charlotte, NC (US); Daniele Iurissevich, Trieste (IT); Fabio Bellemo, Charlotte, NC (US); Massimo Bressanutti, Sesto al Reghena (IT); Maurizio Berliavaz, Charlotte, NC (US); Stefano Pecorari, Charlotte, NC (US)

(73) Assignee: Honeywell International Inc., Charlotte, NC (US)

( * ) Notice: Subject to any disclaimer, the term of this patent is extended or adjusted under 35 U.S.C. 154(b) by 211 days.

(21) Appl. No.: 17/481,577

(22) Filed: Sep. 22, 2021

(65) Prior Publication Data

US 2023/0093605 A1    Mar. 23, 2023

(51) Int. Cl.
*G08B 17/06* (2006.01)
*H05K 1/18* (2006.01)

(52) U.S. Cl.
CPC ............. *G08B 17/06* (2013.01); *H05K 1/181* (2013.01); *H05K 2201/09272* (2013.01); *H05K 2201/10022* (2013.01); *H05K 2201/10151* (2013.01)

(58) Field of Classification Search
CPC .................. G08B 17/06; H05K 1/181; H05K 2201/09272; H05K 2201/10022; H05K 2201/10151
See application file for complete search history.

(56) References Cited

U.S. PATENT DOCUMENTS

| | | | |
|---|---|---|---|
| 10,018,511 B2* | 7/2018 | Yun | G01J 5/0802 |
| 2004/0150926 A1* | 8/2004 | Wilk | H01G 9/008 |
| | | | 361/42 |
| 2004/0212085 A1* | 10/2004 | Nomura | H05K 3/4061 |
| | | | 257/734 |
| 2005/0258913 A1* | 11/2005 | Ito | H03L 1/04 |
| | | | 331/158 |
| 2005/0287424 A1* | 12/2005 | Schwendinger | H01M 50/216 |
| | | | 429/100 |
| 2006/0000919 A1* | 1/2006 | Schwendinger | G05D 23/1902 |
| | | | 236/1 C |
| 2007/0229443 A1* | 10/2007 | Sawada | G09G 3/3611 |
| | | | 345/101 |

(Continued)

FOREIGN PATENT DOCUMENTS

| | | |
|---|---|---|
| DE | 102004021923 | 1/2007 |
| DE | 202019001963 | 6/2019 |

(Continued)

*Primary Examiner* — Joseph H Feild
*Assistant Examiner* — Pameshanand Mahase
(74) *Attorney, Agent, or Firm* — Brooks, Cameron & Huebsch, PLLC

(57) ABSTRACT

Devices, systems, and methods for providing point heat detectors based on surface mounted thermistors are described herein. One circuit board for a point heat detector of a fire sensing system includes a circuit board body having number of corners, at least one hole provided in the circuit board body proximate to one of the corners, and a surface mounted thermistor mounted on at least one corner.

19 Claims, 12 Drawing Sheets

(56) References Cited

U.S. PATENT DOCUMENTS

| | | | | |
|---|---|---|---|---|
| 2009/0219101 | A1* | 9/2009 | Stolpman | H03L 1/04 |
| | | | | 331/70 |
| 2009/0243835 | A1* | 10/2009 | Katou | G08B 29/183 |
| | | | | 340/521 |
| 2009/0316752 | A1* | 12/2009 | Kawase | H01C 1/144 |
| | | | | 374/183 |
| 2009/0321415 | A1* | 12/2009 | Zhang | H05B 3/34 |
| | | | | 219/544 |
| 2011/0075384 | A1 | 3/2011 | Yeates | |
| 2013/0187571 | A1* | 7/2013 | Yeh | H01L 25/167 |
| | | | | 257/79 |
| 2016/0379784 | A1* | 12/2016 | Gong | H01H 50/041 |
| | | | | 361/757 |
| 2017/0207008 | A1* | 7/2017 | Chung | H01C 7/04 |
| 2019/0093850 | A1* | 3/2019 | Tsuchiya | F21S 45/10 |
| 2019/0098761 | A1* | 3/2019 | Yoshida | H01C 7/008 |
| 2019/0155066 | A1* | 5/2019 | Zhang | B32B 17/10477 |
| 2019/0378402 | A1* | 12/2019 | Bouchard | G08B 17/107 |
| 2020/0024047 | A1* | 1/2020 | McNannay | H05K 1/0269 |
| 2021/0120706 | A1* | 4/2021 | Sato | H05K 1/18 |
| 2021/0142743 | A1* | 5/2021 | Ozeki | H05B 45/375 |
| 2021/0209917 | A1* | 7/2021 | Pedersen | G08B 17/107 |
| 2021/0239885 | A1* | 8/2021 | Lee | G03B 13/32 |
| 2021/0378876 | A1* | 12/2021 | Gowans | A61F 13/0216 |
| 2021/0396548 | A1* | 12/2021 | Huang | G01F 1/6965 |
| 2022/0042857 | A1* | 2/2022 | Watanabe | G01R 31/396 |
| 2022/0283040 | A1* | 9/2022 | Weidenfelder | G01K 7/22 |

FOREIGN PATENT DOCUMENTS

| | | |
|---|---|---|
| EP | 3866130 A1 | 8/2021 |
| JP | 2009230510 A | 10/2009 |
| WO | 2020201574 | 10/2020 |

* cited by examiner

POINT HEAT DETECTORS BASED ON SURFACE MOUNTED THERMISTORS

TECHNICAL FIELD

The present disclosure relates to devices, systems, and methods for providing point heat detectors based on surface mounted thermistors.

BACKGROUND

Facilities (e.g., buildings), such as commercial facilities, office buildings, hospitals, and the like, may have a fire detection system that can be triggered during an emergency situation (e.g., a fire) to warn occupants to evacuate. For example, a fire detection system may include a fire alarm control panel within the building and a plurality of point heat detectors located throughout the facility (e.g., on different floors and/or in different rooms of the facility) that can sense a heat condition indicative of a fire occurring in the facility and provide a notification of the heat condition to the occupants of the facility and/or building monitoring personnel via alarms or other mechanisms.

Point heat detectors for fire detection systems are currently based on lead type temperature sensors that have two leads separating the sensor from the surface of a printed circuit board (PCB) to which it is mounted. The capacity to obtain fast response times for air flow temperature measurements is related to the fact that the sensing element, an encapsulated thermistor chip, is spaced above the surface of the printed circuit board through two lead wires (e.g., commercial PSB-S3 type thermistors). This allows the thermistor to detect air temperature with very low influence from heat residing on the PCB (referred to as PCB thermal inertia).

The process of mounting these temperature sensors spaced above the surface of the circuit board (so there is an air gap between the sensors and the surface of the circuit board) is manual and has several drawbacks. For example, the mounting process is expensive, because it needs a human operator at a soldering station. This, generally, leads to a separate production area being required where fire detectors with heat detection are manufactured, with additional human error and non-conformity along with complexity and costs related to such a manufacturing process.

Additionally, since these lead type temperature sensors need to be positioned above the surface of the PCB to space the sensing element from the PCB, the structures take up more space, which can be undesirable in some implementations. For example, having such a tall profile, due to the sensors being mounted away from the surface of the circuit board, limits the ability for designers to reduce the height profile of the heat detector device into which this circuit board is placed.

DETAILED DESCRIPTION

Figure 1A:
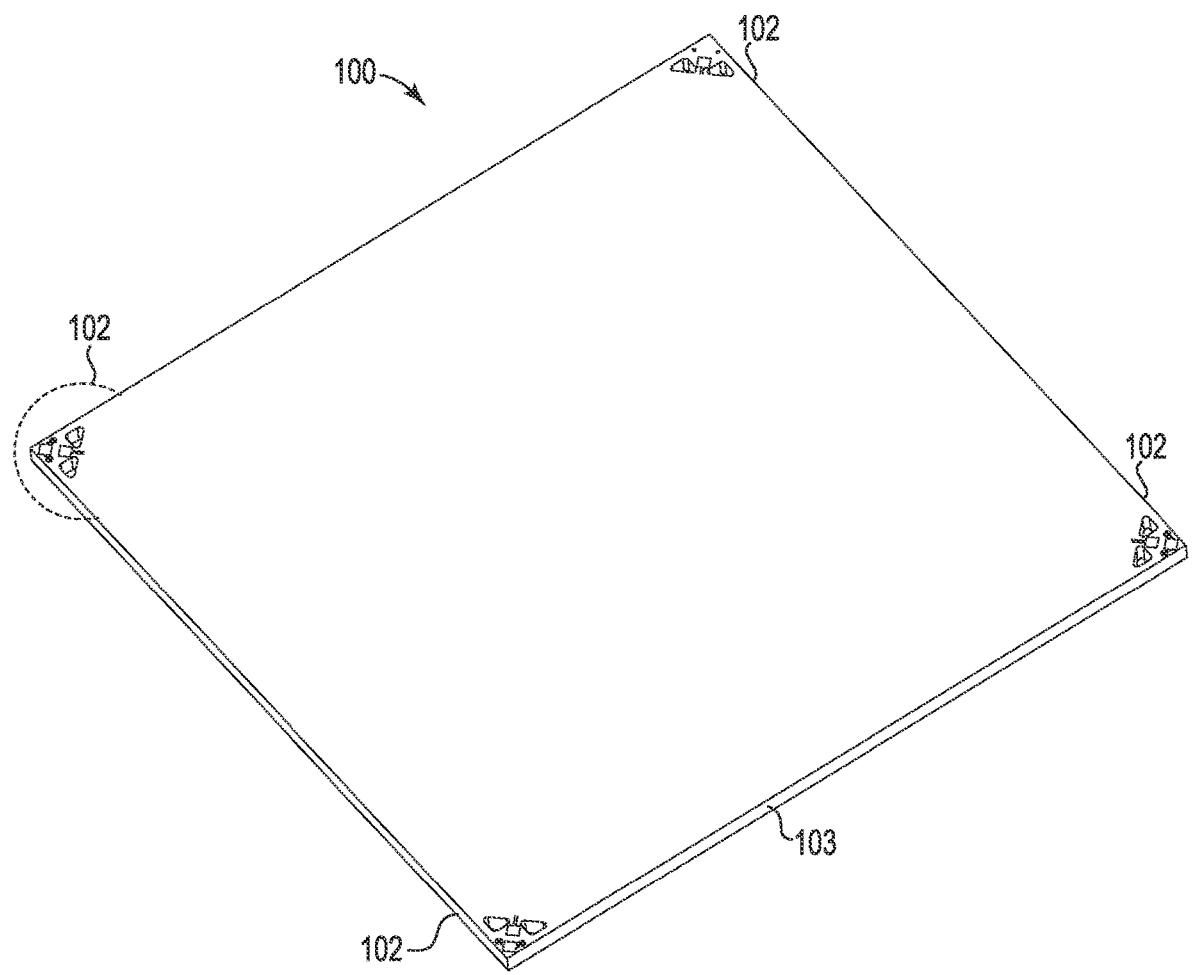
FIG. 1A is an example of a front side of a printed circuit board for a point heat detector of a fire alarm system in accordance with one or more embodiments of the present disclosure.

Devices, systems, and methods for providing point heat detectors based on surface mounted thermistors are described herein.

A surface mounted thermistor based solution, as disclosed herein, provides good sensing performance and will overcome the issues with prior designs. This is possible, in part, because surface mounted thermistors are cheaper than lead type temperature sensors. The manufacturing process can also be simplified as the surface mounted thermistors can be installed during the PCB manufacturing process, thereby eliminating the separate manufacturing steps and issues discussed above.

Further, some embodiments disclosed herein position the surface mounted thermistors such that they do not need to be mounted with a space between the surface mounted thermistor and the surface of the PCB. Such arrangements allow for more design flexibility and compact design than previous form factors.

Additionally, novel directionality processes and temperature estimation technique embodiments are also taught herein.

One example of the point heat detector embodiments of the present disclosure includes a point heat detector device having a point type heat detector that uses surface mounted thermistors, such as four surface mounted NTC (negative temperature coefficient) thermistors that are placed on the corners of a polygonal PCB or on a circular PCB, (e.g. spaced by) 90°. In various embodiments, the sensors can be spaced angularly around a center point of the circuit board at intervals (e.g., such as at regular intervals such as every 90 degrees, every 45 degrees, etc.). These positions are referred to corners as used herein as they represent corners of a polygon. When used on a circular circuit board, the perimeter of the circle can circumscribe the corners of the polygon formed within the circle by the positions of the spaced sensors.

Such a design avoids directionality problems in the heat detector, among other benefits. This is because, having thermistors spaced from each other and/or at angles to each other, allows the air flow to be sensed from different locations and/or directions thereby directionality can be inferred. For example, if a first thermistor senses an air flow change and then a second thermistor at another location senses an air flow change, the direction of the source of the air flow change can be inferred.

Further, if the thermistors sense air flow entering a device housing from different directions, the sensing of heated air flow and by one thermistor and not another can be indicative of which direction the heat source is located.

Additionally, the PCB has one or more apertures situated between a central portion of the PCB and the surface mounted thermistor in order to reduce the effects of thermal inertia of the PCB on the thermistor.

Any remaining effects of thermal inertia can be counteracted by an observer process, for example a proportional integral observer (PIO) process. Specifically, the PIO can be used to estimate the airflow temperature using the temperature measured by the thermistor and a model of the airflow-heat detector system.

Due to the lower profile of embodiments of the present disclosure, the PCB with surface mounted system can be placed in a low-profile housing (shown in FIGS. 4-6) with a mechanical configuration designed to effectively direct airflow toward the surface mounted thermistors. With a surface mounted thermistor-based embodiment, as disclosed herein, fire detector devices can be manufactured with integrated thermal detection including, for example, thermal, photo-thermal, multicriteria (e.g. COPTIR) detectors, with a lower profile (and consequently better aesthetics) at a lower cost. A COPTIR device combines four separate sensing elements in one unit:

1. Electrochemical cell technology monitors carbon monoxide (CO) produced by smoldering fires;
2. A photoelectric (P) chamber senses airborne particulate for smoke detection;
3. Thermal (T) detection monitors temperature; and
4. Infrared (IR) sensing measures ambient light levels and flame signatures.

This cost reduction includes the cost of components as the price of one lead type thermistor is more than four surface mounted thermistors. The manufacturing process cost is also less as the complete surface mounted mounting process can be accomplished with a unique production cell wherein multiple detector types can be produced for photo, thermal, and photo-thermal fire detectors. Additionally, multiple PCB's can be manufactured simultaneously, as discussed in more detail below with regard to FIG. 3, further reducing the time needed and manufacturing cost of the devices.

The devices of the present disclosure can also result in smaller device size and less and smaller packaging elements. For example, the present devices can affect a plastic parts reduction as a new, low profile detector cover for photo, thermal, and photothermal detectors can be used, and the current plastic element used to compensate directionality, in some photo-thermal detectors, can be eliminated.

In some proposed embodiments, the proposed mechanical solution integrates four surface mounted thermistors in a rectangular PCB with specific mechanical features in the detector cap (e.g., to direct airflow, protect the thermistor, and drain water away from it) and, in some embodiments, dedicated software (e.g., stored in memory on the detector device and executable by a controller, such as a microprocessor) compensates for the system thermal inertia that cannot be overcome by the physical design. The above features are features not possible in the prior art.

In one embodiment, a proposed surface mounted solution for thermal detection in fire sensors includes: four surface mounted thermistors (for example, 0603 NTC thermistors), mounted near the edge of the PCB in the corners of a square or rectangular PCB. In some embodiments, a square/rectangular shape of the PCB provides a compact and consequently inexpensive PCB panel layout with a suitable aperture pattern between them and the rest of the PCB, to minimize the influence of the PCB on the surface mounted thermistor in terms of thermal inertia. The use of four thermistors can be beneficial, for example, as providing one for each corner, avoids directionality problems of the heat detector.

Further, in some embodiments, a mechanical configuration of the plastic parts (cover and base) of the fire detector can be provided with the surface mounted configuration on the PCB in order to direct the air flow efficiently toward the surface mounted thermistor and assure a certain degree of protection to the circuit board and thermistor.

As discussed above, embodiments can also include dedicated software to correct the measured thermistor temperature on the basis of an air flow temperature model. This functionality is used to compensate for the thermal inertia of the surface mounted configuration.

The air flow temperature model can be accomplished, for example, by measurements of the real airflow temperatures (inputs) and thermistors outputs of the real system. The dedicated software calculates an air flow temperature to feed the model of the system in order to minimize the difference between the effective measured temperature and the estimation of the thermistor temperature (e.g. using a Proportional Integral Observer (PIO) process). The parameters of the model can be stored in memory on the device.

The type of data obtained by the dedicated software can be volatile integer data representing environment temperature. Additionally, this data can be stored in random access memory (RAM) and used for fire alarm generation or, at application level, stored into a non-volatile RAM (NVRAM) for diagnostic purposes to evaluate the environmental temperature using different types of algorithms (e.g., average, mode, etc.). This layer can be provided, for example, to the fire system control panel.

In this detailed description, reference is made to the accompanying drawings that form a part hereof. The drawings show by way of illustration how one or more embodiments of the disclosure may be practiced.

These embodiments are described in sufficient detail to enable those of ordinary skill in the art to practice one or more embodiments of this disclosure. It is to be understood that other embodiments may be utilized and that process, electrical, and/or structural changes may be made without departing from the scope of the present disclosure.

As will be appreciated, elements shown in the various embodiments herein can be added, exchanged, combined, and/or eliminated so as to provide a number of additional embodiments of the present disclosure. The proportion and the relative scale of the elements provided in the figures are intended to illustrate the embodiments of the present disclosure and should not be taken in a limiting sense.

The figures herein follow a numbering convention in which the first digit or digits correspond to the drawing figure number and the remaining digits identify an element or component in the drawing. Similar elements or components between different figures may be identified by the use of similar digits. For example, 102 may reference element "02" in FIG. 1, and a similar element may be referenced as 202 in FIG. 2.

As used herein, "a", "an", or "a number of" something can refer to one or more such things, while "a plurality of" something can refer to more than one such things. For example, "a number of components" can refer to one or more components, while "a plurality of components" can refer to more than one component.

Figure 1B:
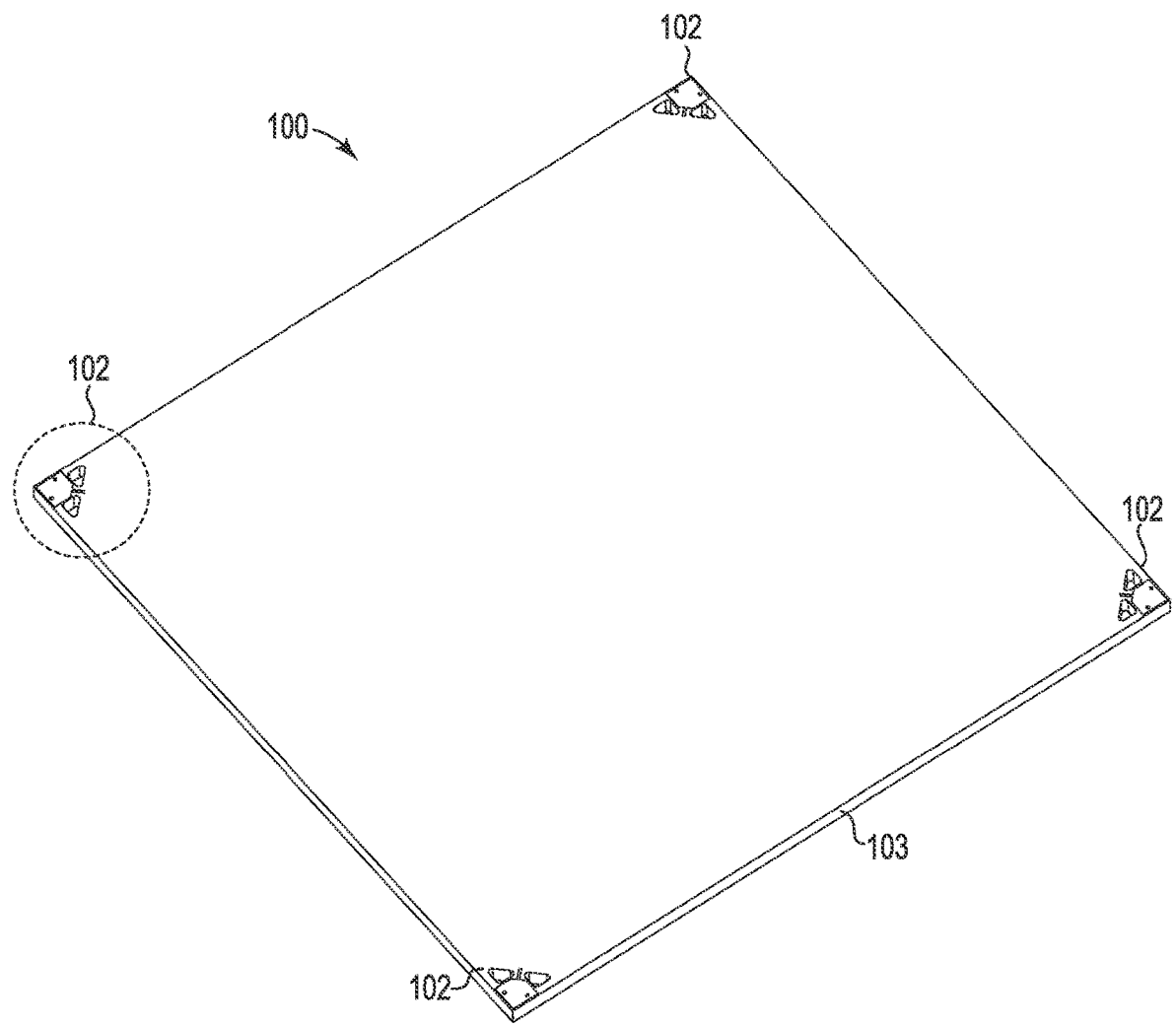
FIG. 1B is an example of a back side of a printed circuit board for a point heat detector of a fire alarm system in accordance with one or more embodiments of the present disclosure.

FIG. 1A is an example of a front side of a printed circuit board for a point heat detector of a fire alarm system in accordance with one or more embodiments of the present disclosure. FIG. 1B is an example of a back side of a printed circuit board for a point heat detector of a fire alarm system in accordance with one or more embodiments of the present disclosure.

Point heat detectors are important components in some types of fire detection systems. Also, important are the controllers that provide the detection analysis, alarming functionality, and communication functions with other fire system devices. The printed circuit board 100, designed according to the embodiments of the present disclosure, can provide these functions in one unitary circuit board.

In the implementation shown in FIGS. 1A and 1B, surface mounted thermistors 102 are provided on the corners, defined by the edge 103 of the printed circuit board 100. In this manner, costs and manufacturing time and complexity can be reduced, among other benefits. This embodiment shows apertures formed near the corner. These apertures insulate the thermistor from the thermal inertia of the rest of the circuit board. This is important since the thermistor is detecting temperature and the circuit board is generating heat that may create false readings at the thermistor.

Any number of apertures can be provided. In FIGS. 1A and 1B, there are two apertures with a bridge between them that allows for circuitry to span the bridge and connect the thermistor to other circuitry of the circuit board.

Figure 1C:
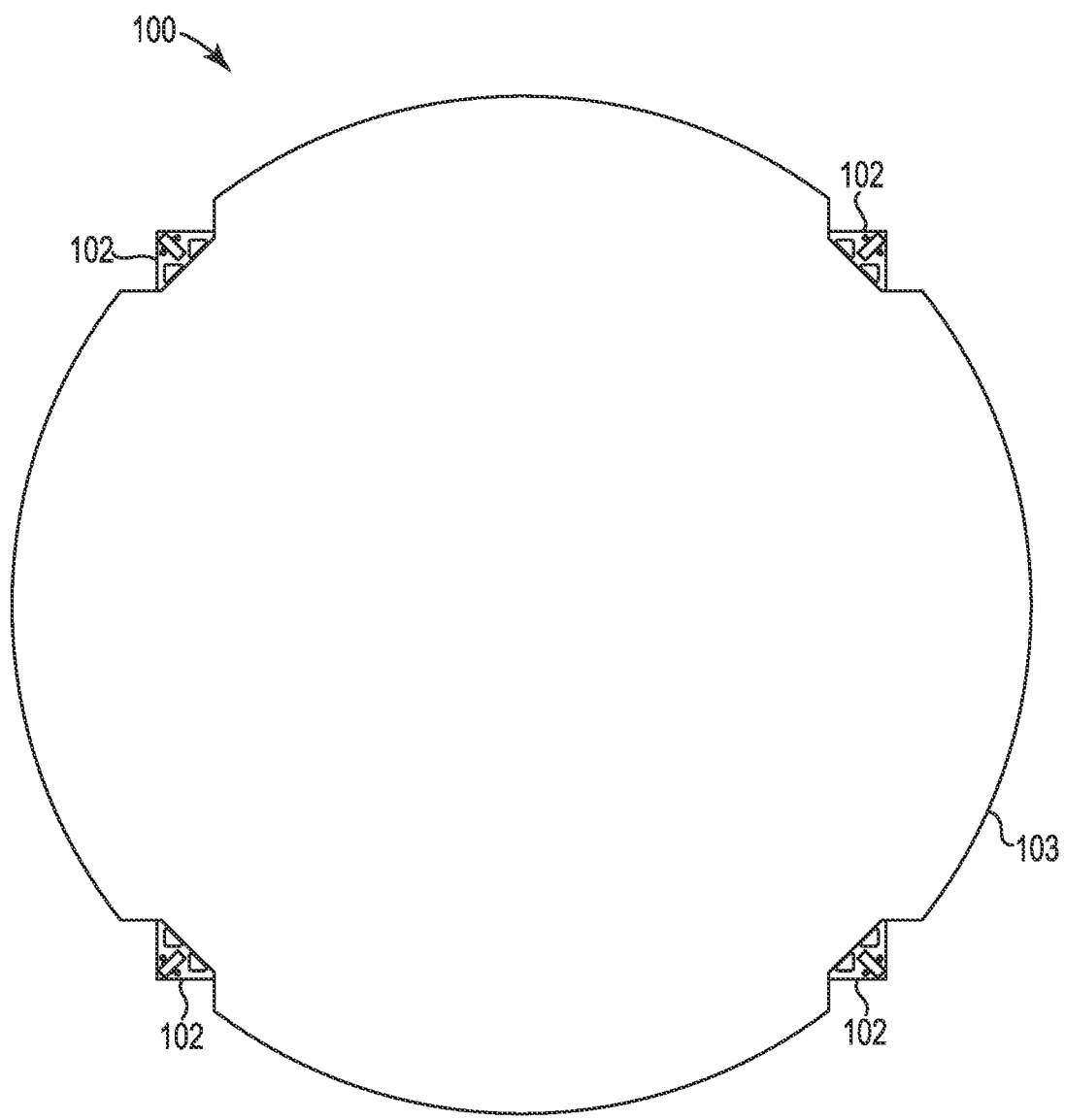
FIG. 1C is an example of a front side of a circular printed circuit board for a point heat detector of a fire alarm system in accordance with one or more embodiments of the present disclosure.

FIG. 1C is an example of a front side of a circular printed circuit board for a point heat detector of a fire alarm system in accordance with one or more embodiments of the present disclosure. As shown in this embodiment, the sensors can be spaced angularly around a center point of the circuit board at intervals (e.g., at regular intervals such as every 90 degrees, every 45 degrees, etc.). These positions are referred to as corners as used herein. When used on a circular circuit board, the perimeter of the circle can circumscribe the corners of the polygon formed within the circle by the positions of the spaced sensors.

Figure 2A:
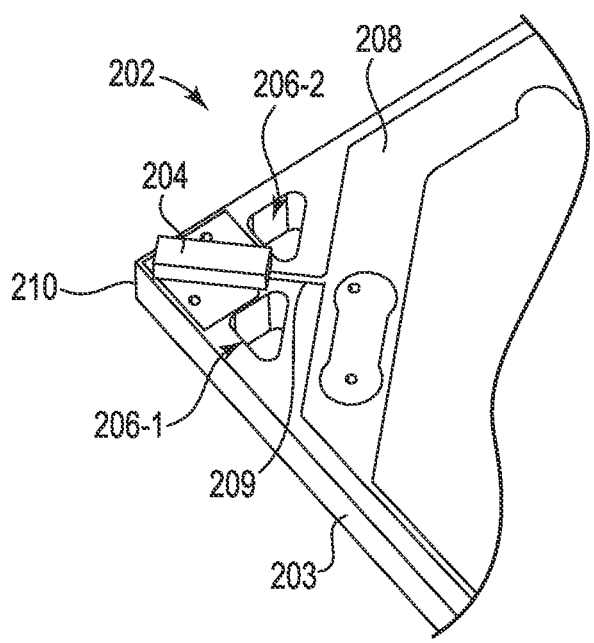
FIG. 2A is an example of a front side of a corner of a printed circuit board for a point heat detector of a fire alarm system having a surface mounted thermistor thereon in accordance with one or more embodiments of the present disclosure.
Figure 2B:
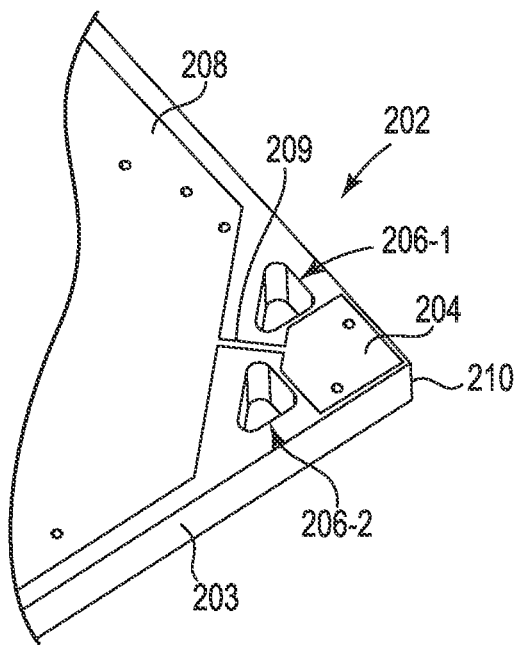
FIG. 2B is an example of a back side of a corner of a printed circuit board for a point heat detector of a fire alarm system having a surface mounted thermistor thereon in accordance with one or more embodiments of the present disclosure.

FIG. 2A is an example of a front side of a corner of a printed circuit board for a point heat detector of a fire alarm system having a surface mounted thermistor thereon in accordance with one or more embodiments of the present disclosure. FIG. 2B is an example of a back side of a corner of a printed circuit board for a point heat detector of a fire alarm system having a surface mounted thermistor thereon in accordance with one or more embodiments of the present disclosure.

As discussed with respect to FIGS. 1A and 1B, the corner area 202 includes a corner 210 formed by two sides of the edge 203 of the circuit board. The corner area includes a thermistor 204 mounted to the circuit board and positioned between the edge 203 and a number of apertures 206 (this embodiment shows two, 206-1 and 206-2, but any suitable number of apertures can be used). The thermistor 204 is electrically connected via bridge circuitry 209 positioned between the apertures 206 to other circuitry 208 of the circuit board.

Figure 3:
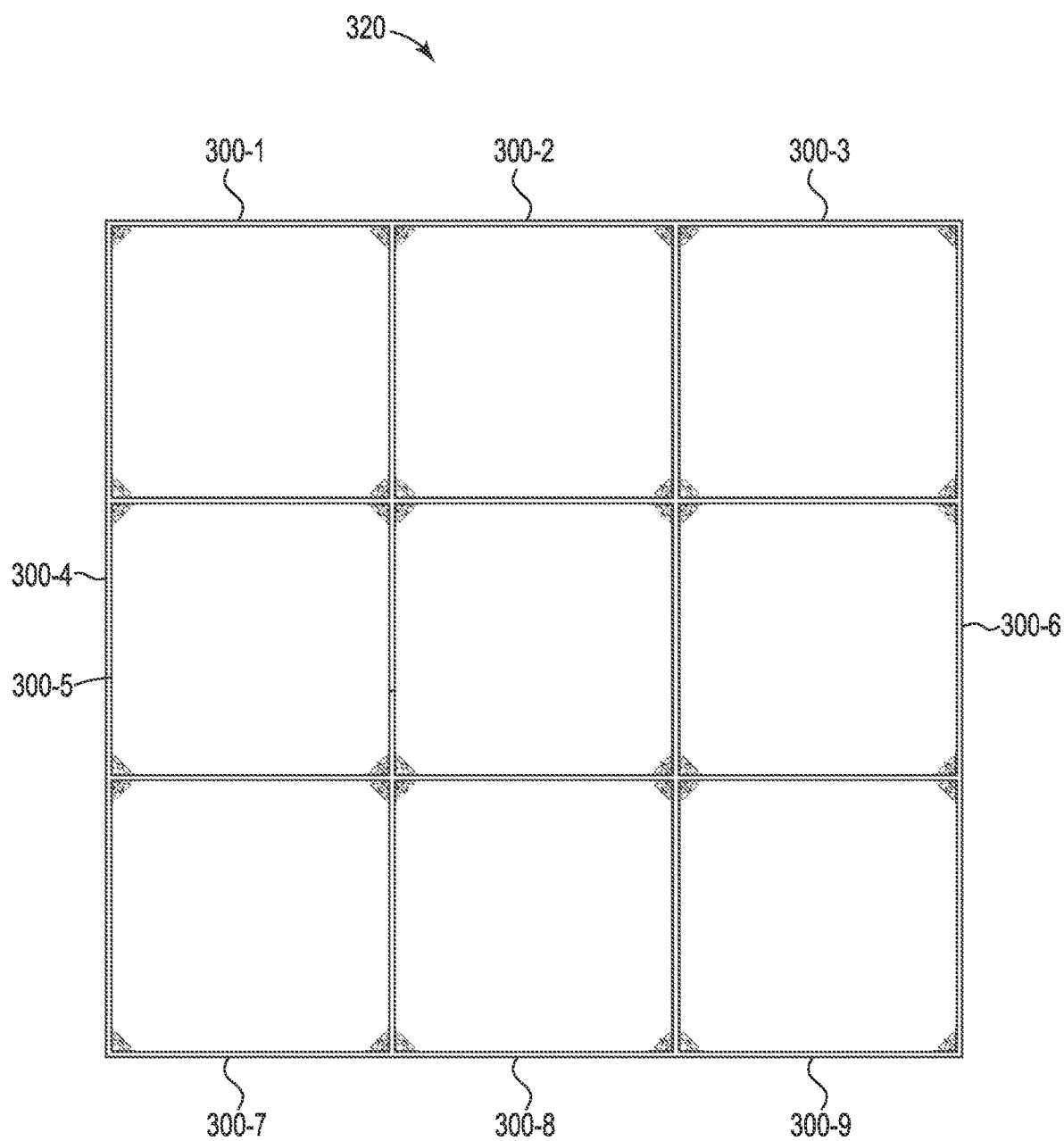
FIG. 3 is a printed circuit board panel having nine printed circuit boards printed together on the panel, in accordance with one or more embodiments of the present disclosure.

FIG. 3 is a printed circuit board wafer having nine printed circuit boards printed together on the wafer, in accordance with one or more embodiments of the present disclosure. As can be ascertained by the layout of the circuit boards 300-1 to 300-9 on the wafer 320, since the corners are formed adjacent to each other, the formation of the associated thermistor circuitry can be conveniently fabricated. This was not possible with previous wired designs.

Figure 4:
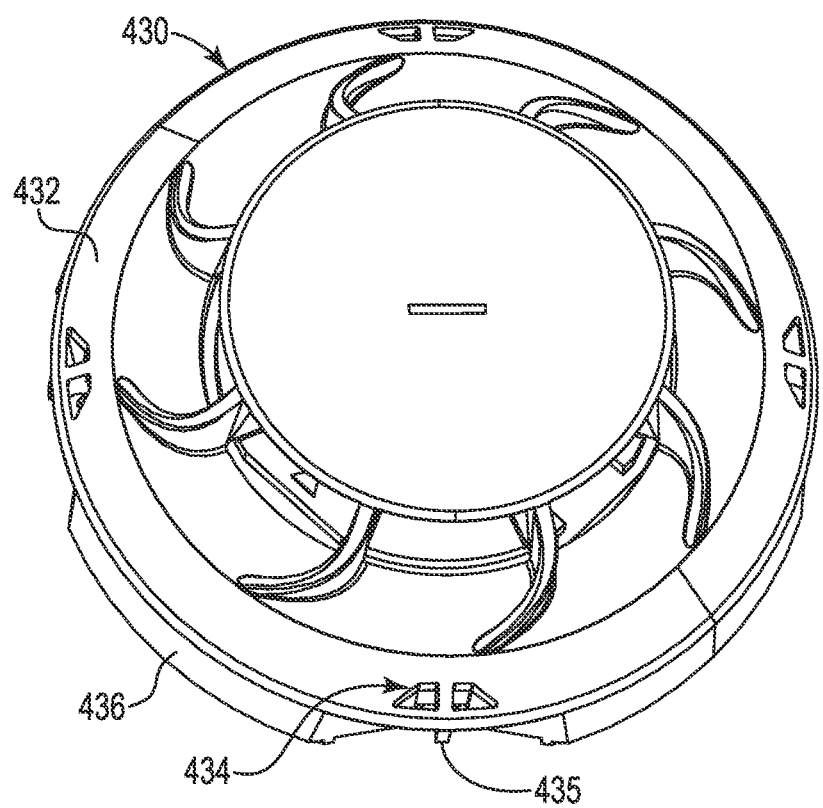
FIG. 4 is an angled bottom view of the cap of a point heat detector, in accordance with one or more embodiments of the present disclosure.

FIG. 4 is an angled bottom view of a point heat detector, in accordance with one or more embodiments of the present disclosure. The embodiment of FIG. 4 includes a number of air flow apertures 434 formed in the bottom surface 432 of the housing 430. The position of the apertures shown in the embodiment of FIG. 4 allow for condensate or moisture to drain out of the detector. The apertures also facilitate the flow of air around the thermistor. In the configuration shown in FIG. 4, the position of the apertures on the bottom surface of the detector allows air flow to be detected by the thermistor that is directly below the detector. This is beneficial because the detector is often mounted to a ceiling of a room to be monitored.

The housing 430 also includes a cut out portion in side surface 436 to allow the corner of the circuit board to protrude out of the housing. In this manner, the thermistor can be exposed to the air flow in the area to be monitored, rather than the air within the housing.

The housing 430 also has a tamper resistant structure 435 located in the cut out portion to keep objects from entering the thermistor sensing area. This reduces the likelihood that the thermistor may be damaged by tampering or other actions.

Figure 5:
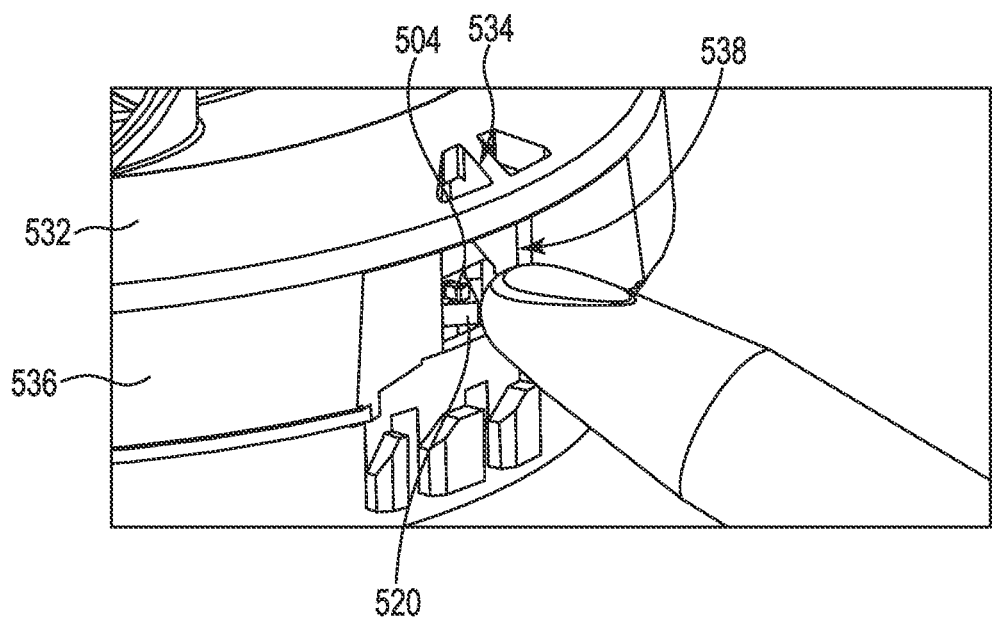
FIG. 5 is an angled side view of a point heat detector showing a corner of a printed circuit board with a surface mounted thermistor provided therein, in accordance with one or more embodiments of the present disclosure.

FIG. 5 is an angled side view of a point heat detector showing a corner of a printed circuit board with a surface mounted thermistor provided therein, in accordance with one or more embodiments of the present disclosure.

In some embodiments, the cut out portion can be sized to restrict the ability for a tamperer to stick an item into the cut out portion of the housing to access the thermistor 504 or the circuit board 520. Such an implementation is shown in FIG. 5 where the small sized cut out aperture 538 in the side wall 536 is sized to restrict access to a tamperer's finger tip as illustrated in FIG. 5. Further, although apertures 534 are formed in the bottom surface 532, they are small enough that tampering, with a finger or other similar sized object is not possible.

Figure 6:
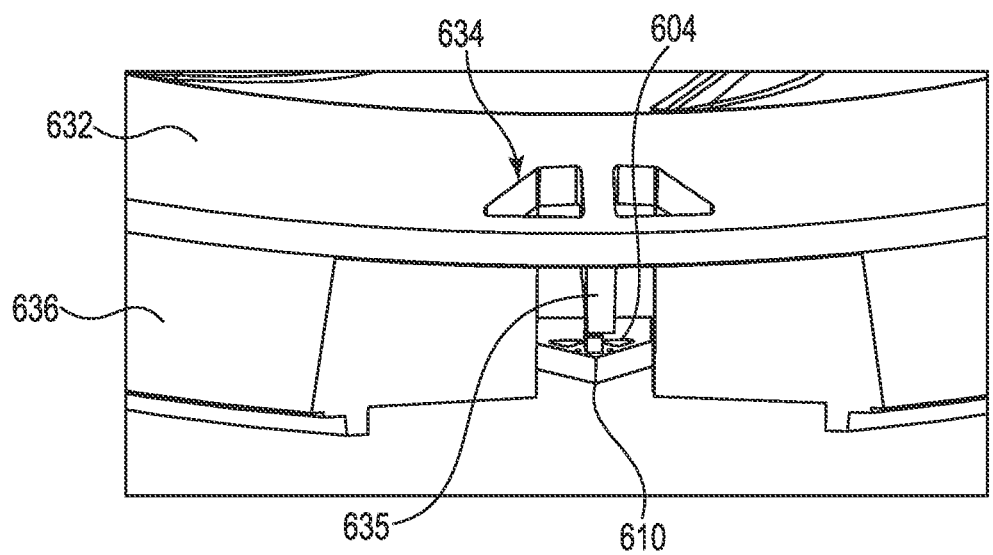
FIG. 6 is a side view of a point heat detector showing a corner of a printed circuit board with a surface mounted thermistor provided therein, in accordance with one or more embodiments of the present disclosure.

FIG. 6 is a side view of a point heat detector showing a corner of a printed circuit board with a surface mounted thermistor provided therein, in accordance with one or more embodiments of the present disclosure. As FIG. 6 illustrates, the side surface 636 has a cut out portion that allows the corner 610 of the circuit board to protrude out from the inside of the housing. The apertures 634 provide more avenues for air to flow to and from the area surrounding the thermistor 604, and the tamper resistant structure 635 restricts access to the thermistor and circuit board through the cut out portion.

Additionally, in some embodiments, the cut out portion has sloping surfaces (to each side of the cut out aperture) that get closer to the corner 610 as the surfaces approach the aperture through which the corner protrudes. This allows air to be directed toward the thermistor 604. It is preferable that the sloping surfaces adjacent the aperture be symmetrical to provide uniform air flow from both directions along the sloping surfaces toward the thermistor 604.

Figure 7:
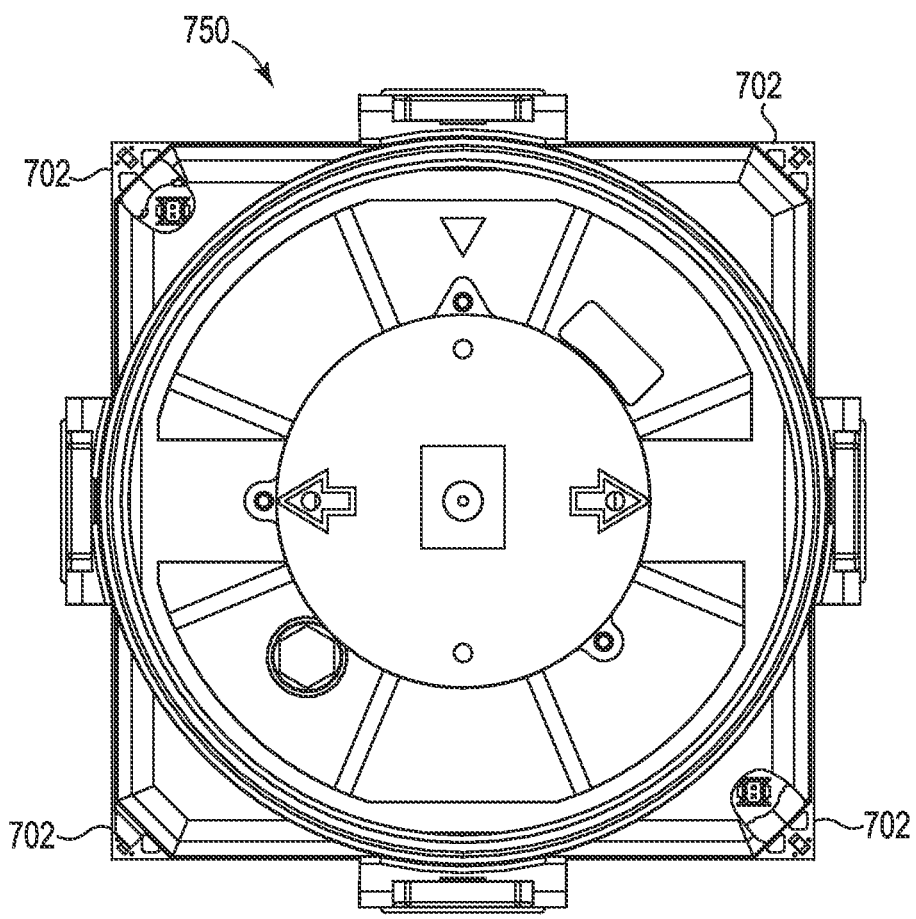
FIG. 7 is a bottom view of a point heat detector with an outer cover and the detector cap removed that shows the corners of a printed circuit board with surface mounted thermistors provided therein, in accordance with one or more embodiments of the present disclosure.

FIG. 7 is a bottom view of a point heat detector with an outer housing removed that shows the corners of a printed circuit board with surface mounted thermistors provided therein, in accordance with one or more embodiments of the present disclosure. Such an embodiment can be used to provide directionality of a heat source that is detected by the thermistors.

For example, the system shown in FIG. 7 has four surface mounted thermistors mounted near the edges of the circuit board with a cover 750 being mounted thereon. Being that they are mounted on the corners 702 of a rectangular circuit board, the angular difference is 90° between adjacent thermistors, with the thermistors reporting their data to a microcontroller to measure air temperature in four equally spaced directions.

To further refine the directionality detection, some embodiments can include a digital compass (e.g., Honeywell 1 axis low cost Magnetoresistive Sensors HMC1051), integrated in the heat point detector, to provide all installed detectors, regardless of their mounting orientation, a unique reference system (e.g., direction of Earth's magnetic field). Then, novel dedicated software described herein can be used to determine the direction of the airflow on the basis of the measurements of the four thermistors and the indication of the direction of Earth's magnetic field from the digital compass. This directionality concept will be discussed in more detail with respect to FIGS. 9-12.

Figure 8:
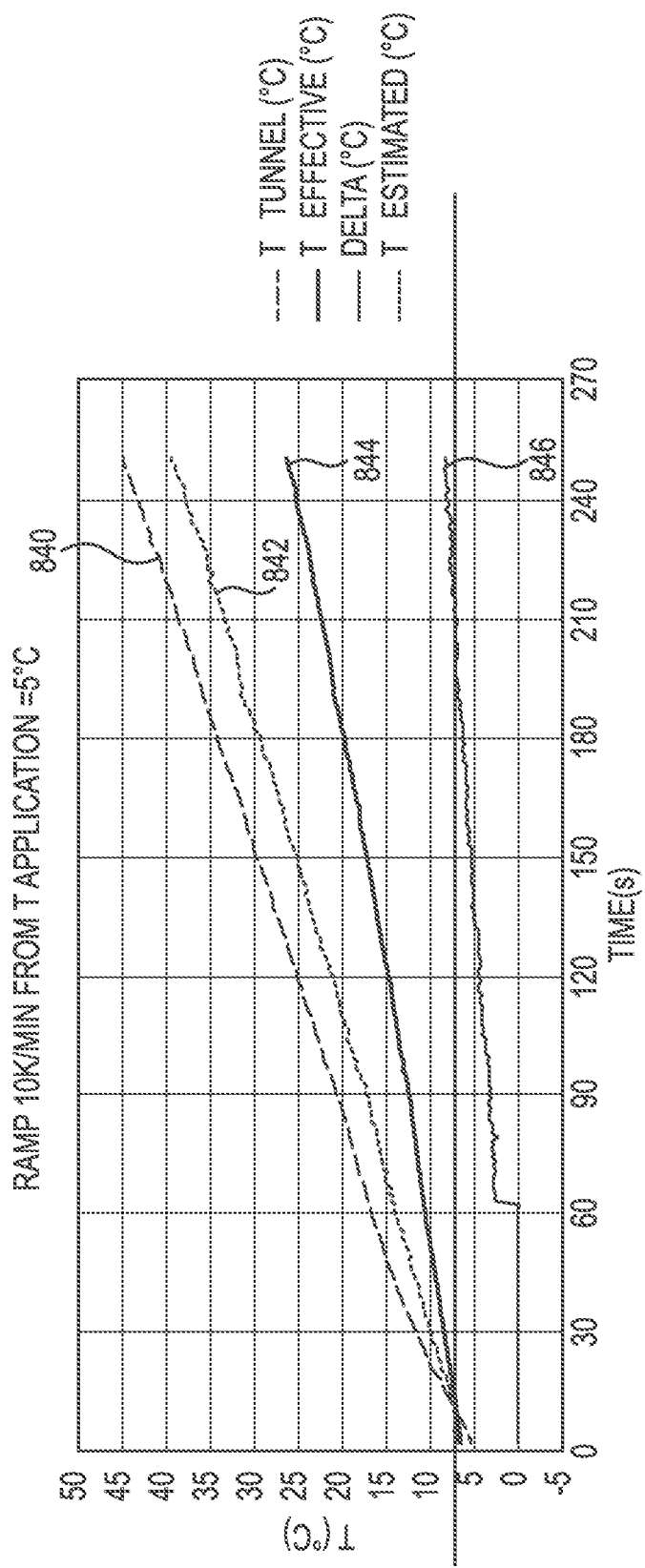
FIG. 8 is a graph illustrating the estimation process for determining the temperature within a space monitored by the point heat detector in accordance with one or more embodiments of the present disclosure.

FIG. 8 is a graph illustrating the estimation process for determining the temperature within a space monitored by the point heat detector in accordance with one or more embodiments of the present disclosure. The apertures 206 and the embodiments of FIGS. 4 and 5 reduce the thermal inertia due to the circuit board and to the plastic parts of the detector but the temperature measured by the thermistors can still be affected by a remaining thermal inertia. In order to increase the accuracy of the temperature measurement, a process based on the control system theory (e.g., unknown input and state observer) has been created to estimate the temperature of the space being monitored.

The graph of FIG. 8 shows the actual temperature at 840, the estimated temperature based on the algorithm and process described herein at 842, the sensed temperature 844 as measured by the thermistor, In the embodiment illustrated in FIG. 8, an alarm threshold is met when: the estimated temperature value at any time is greater than or equal to a temperature threshold (S point heat detectors) or when a function of the Rate of Rise of temperature is greater than or equal to a certain value (R point heat detectors). Accordingly, in this embodiment, there are several ways in which to quantify if an alarm should be initiated.

Air flow temperature measuring takes into account several phenomena, namely, non-linear convection resistance (attributable to things like air speed and temperature difference), thermal conduction resistance thermal capacitances due to the thermistors and other elements of the system. The expectation is to estimate the air flow temperature by removing the other elements effecting the result due to system conditions. This can be accomplished using a mathematical model and system control theory. This can be an iterative process where each estimate is compared with a measured thermistor temperature, until there is very little difference between the measured and estimated thermistor temperatures.

Figure 9:
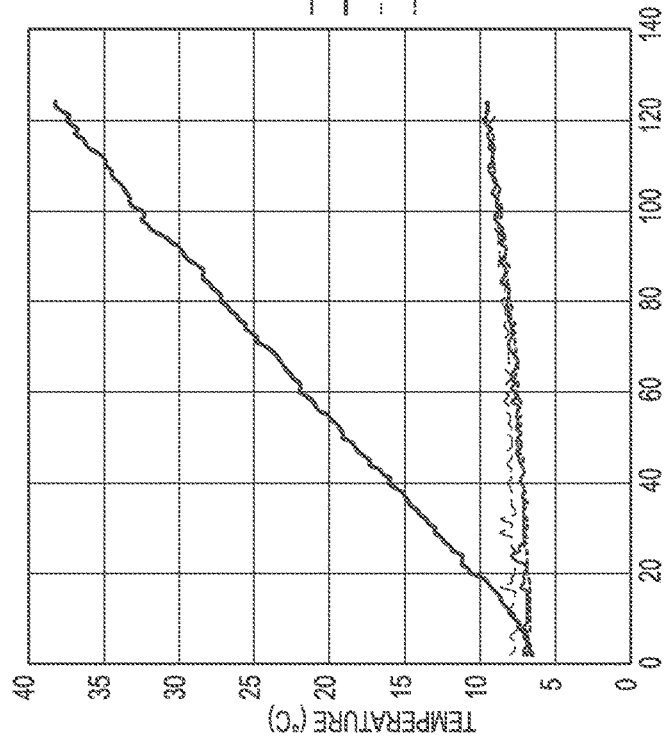
FIG. 9 is a graph illustrating the thermistor response to air flow and an associated illustration showing the air flow direction blowing on a detector in accordance with one or more embodiments of the present disclosure.

FIG. 9 is a graph illustrating the thermistor response to air flow and an associated illustration showing the air flow direction blowing on a detector in accordance with one or more embodiments of the present disclosure. In this example, the heated air flow is coming from the east, directly at thermistor 2 (TH2).

Consequently, on the graph, thermistor 2 shows a rapid increase in temperature, but thermistors 1, 3, and 4 do not show a dramatic increase in temperature. The point heat detector analyzes this information to determine the direction that is the likely location of the heat source (fire), which can be used to direct emergency personnel and/or determine evacuation strategies, among other uses. In this example, the data indicates the heat source is east of the detector.

Figure 10:
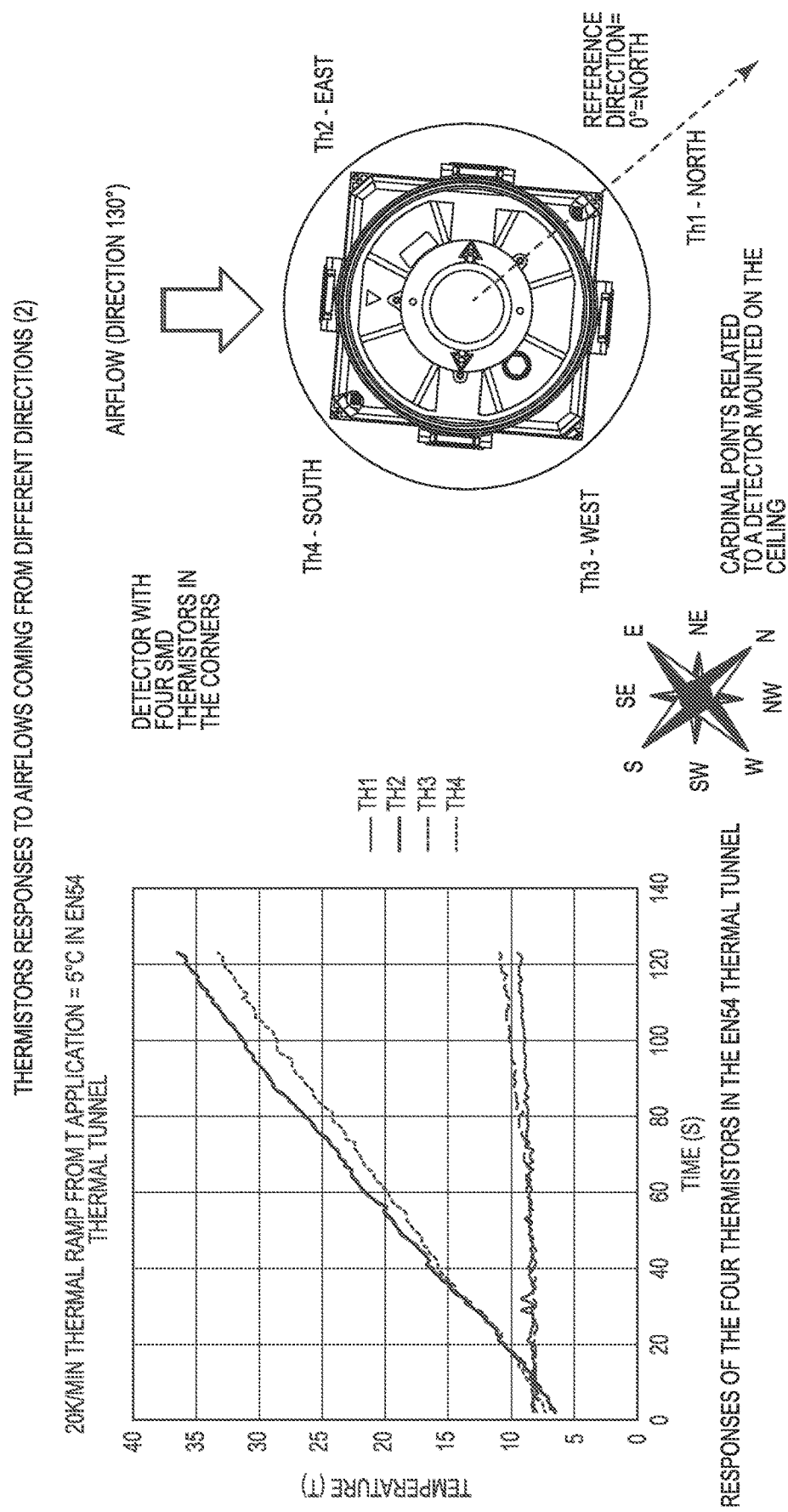
FIG. 10 is another graph illustrating the thermistor response to air flow and an associated illustration showing the air flow direction blowing on a detector in accordance with one or more embodiments of the present disclosure.

FIG. 10 is another graph illustrating the thermistor response to air flow and an associated illustration showing the air flow direction blowing on a detector in accordance with one or more embodiments of the present disclosure. In this example, the heated air flow direction is from the southeast of the detector. Since the air flow direction is between two thermistors, the graph shows detected heated air flow at thermistors 2 and 4 (east and south, respectively). Accordingly, the detector can analyze this data and determine that the heat source is in the southeast direction from the detector.

Further, in some embodiments, the controller of the detector can determine the difference in the slopes of the two sets of data from thermistors 2 and 4 and use that information to determine a more accurate direction of the heat source. For example, on this graph, there is more heat near thermistor 2 (the slope is greater than that of the data for thermistor 4) and this data can be used to determine that the heat source is closer to the east thermistor. This information can be used to determine how much closer to the east the heat source is.

Figure 11:
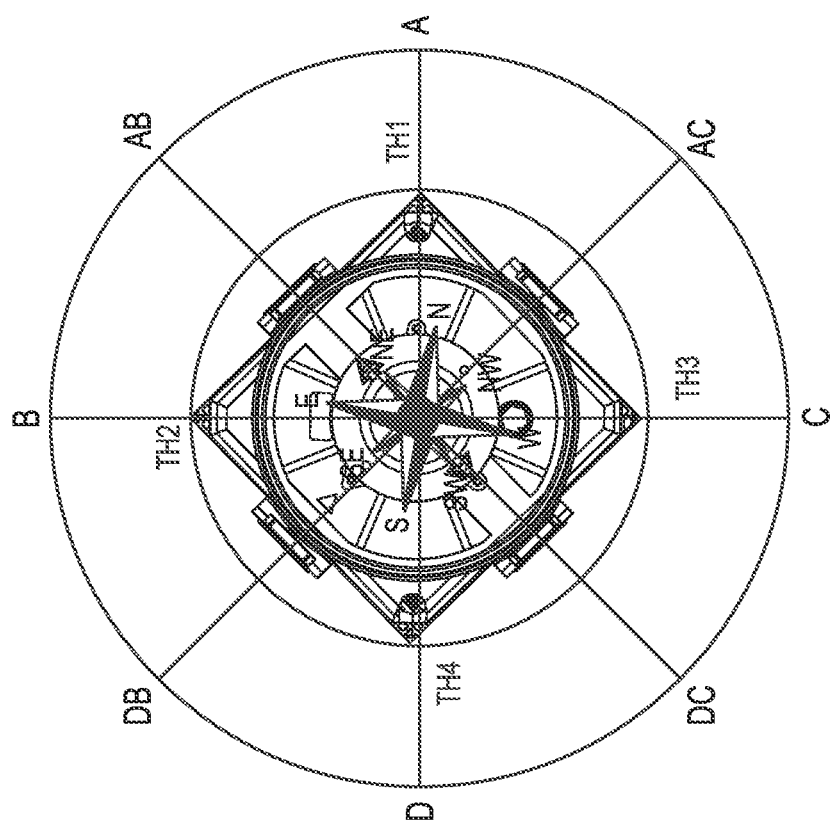
FIG. 11 is an illustration of possible direction choices for a heat flow direction algorithm in accordance with one or more embodiments of the present disclosure.

FIG. 11 is an illustration of possible direction choices for a heat flow direction algorithm in accordance with one or more embodiments of the present disclosure. Heat flow direction processes utilizing mathematical algorithms can be very helpful in determining the location of a heat source.

One such process reads the sensed temperature at each thermistor 1, 2, 3, and 4. It then calculates a heat flow direction for example preliminarily down to 45 degrees based on balancing between two thermistors with heat readings. To further precision the location, the controller can determine a correction factor based on the temperature slope differences between adjacent thermistors. The detector then combines these values to calculate a more precise direction.

In some embodiments, digital compass data can also be used. Here, the digital compass data is determined and the non-compass direction data is then rotated to correlate to the digital compass reference direction information (e.g., to a due north digital compass reading).

For the device illustrated in FIG. 11, the direction of a heat source can be pinpointed with an accuracy of 45 degrees (halfway between two thermistors oriented at a 90 degree angle to each other). For example, if thermistors 3 and 4 register elevated temperature readings, then the controller can determine whether the heat source is located in the direction C, D, or DC depending on if one or both of the sensed temperatures meet a threshold value indicating a heat source is near that thermistor. Alternatively, the evaluation can be based on if one or both of the slopes of the temperature data meet a threshold value indicating a heat source is near that thermistor. In some embodiments, this analysis can include determining that the changes in temperature are above a threshold when comparing the elevated temperature to that of a thermistor that is not elevated or is also elevated, but not to the level of the thermistor with the higher temperature.

Figure 12:
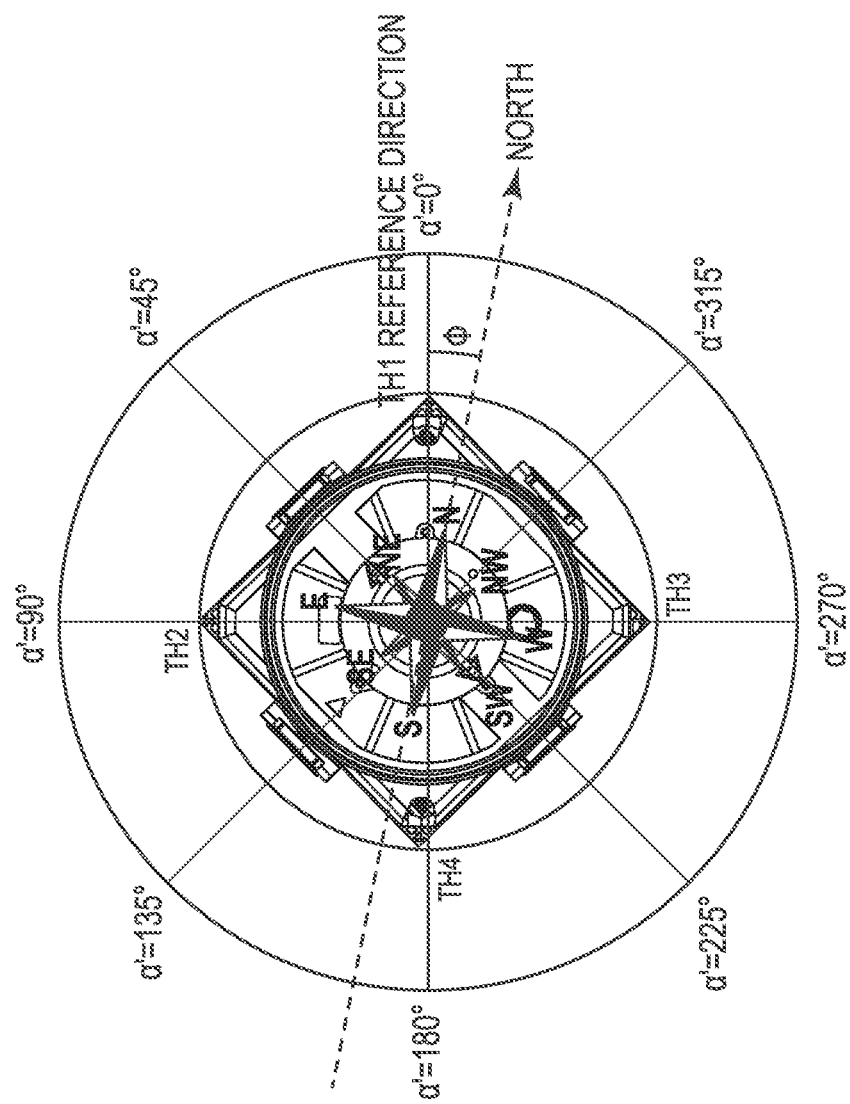
FIG. 12 is an illustration of another set of possible direction choices for a heat flow direction algorithm in accordance with one or more embodiments of the present disclosure.

FIG. 12 is an illustration of another set of possible direction choices for a heat flow direction algorithm in accordance with one or more embodiments of the present disclosure. In this embodiment, as described briefly above, the detector, via the controller, can calculate a correction factor that can further precision the direction determined by the analysis by the detector.

For example, an evaluation of the differences between temperature slopes (ROR: Rate of Rise of the outputs of the four thermistors) through a function DifROR(T1, T2, T3, T4) permits a calculation of a correction factor $\beta$ which is added to $\alpha$ (the determined direction based on the sensed temperature data that determined which thermistors had elevated readings) in order to obtain a more accurate evaluation of the heat flow direction ($\alpha'=\alpha+\beta$).

A digital compass provides the installed detector, regardless of its mounting orientation, a unique reference system (direction of Earth's magnetic field): this results in a digital value corresponding to the angle $\varphi$ between the direction of Earth's magnetic field and a reference direction of the circuit board (e.g., the axis between the thermistor th1 and th4). Finally, a rotation of the reference system is applied ($\alpha''=\alpha'+\varphi$) in order to calculate the cardinal point CP (the most accurate determination of the heat flow direction). Accordingly, possible values of CP are: unknown direction, N, S, E, W, NE, NW, SE, SW.

As discussed, through use of the embodiments of the present disclosure point heat detectors can be more compact, easier and more cost effective to produce, with more uniformity between produced devices and less opportunity for human error, and can be more accurate in detecting temperatures of air flow and in determining directions of heat sources. Such features can be very beneficial in detecting fires and alerting emergency personnel and building occupants early in a fire event, among other benefits.

Although specific embodiments have been illustrated and described herein, those of ordinary skill in the art will appreciate that any arrangement calculated to achieve the same techniques can be substituted for the specific embodiments shown. This disclosure is intended to cover any and all adaptations or variations of various embodiments of the disclosure.

It is to be understood that the above description has been made in an illustrative fashion, and not a restrictive one. Combination of the above embodiments, and other embodiments not specifically described herein will be apparent to those of skill in the art upon reviewing the above description.

The scope of the various embodiments of the disclosure includes any other applications in which the above structures and methods are used. Therefore, the scope of various embodiments of the disclosure should be determined with reference to the appended claims, along with the full range of equivalents to which such claims are entitled.

In the foregoing Detailed Description, various features are grouped together in example embodiments illustrated in the figures for the purpose of streamlining the disclosure. This method of disclosure is not to be interpreted as reflecting an intention that the embodiments of the disclosure require more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A circuit board for a point heat detector of a fire sensing system, comprising:
    a circuit board body having number of corners;
    at least one aperture provided in the circuit board body proximate to one of the corners;
    a surface mounted thermistor mounted on at least one corner; and
    wherein the circuit board body has an edge at its periphery and wherein the surface mounted thermistor is positioned on the corner having the aperture proximate thereto and positioned between the edge and the at least one aperture.

2. The circuit board for a point heat detector of claim 1, wherein the circuit board body includes at least two apertures proximate to one of the corners and wherein the circuit board body includes a bridge between at least two of the apertures that has circuitry thereon to connect the surface mounted thermistor to another component of the circuit board body.

3. A point heat detector of a fire sensing system, comprising:
    a detector housing; and
    a circuit board body having number of corners;
        at least one aperture provided in the circuit board body proximate to one of the corners;
        a surface mounted thermistor mounted on at least one corner; and
        wherein the circuit board body has an edge at its periphery and wherein the surface mounted thermistor is positioned on the corner having the aperture proximate thereto and positioned between the edge and the at least one aperture.

4. The point heat detector of claim 3, wherein the detector housing includes at least one aperture in a side surface of the housing allowing at least one corner having the surface mounted thermistor thereon to protrude through the aperture.

5. The point heat detector of claim 3, wherein the circuit board body is positioned inside the detector housing and wherein the detector housing includes at least one cut out portion allowing at least one corner having the surface mounted thermistor thereon to protrude through the at least one cut out portion.

6. The point heat detector of claim 5, wherein the at least one cut out portion has an aperture allowing at least one corner having the surface mounted thermistor thereon to protrude through the aperture of the at least one cut out portion.

7. The point heat detector of claim 6, wherein the housing has a bottom surface and wherein the bottom surface has at least one aperture proximate to the thermistor.

8. The point heat detector of claim 6, wherein the circuit board has a thermistor mounted at each corner of the circuit board.

9. The point heat detector of claim 8, wherein each corner of the circuit board has a number of aperture formed therein.

10. The point heat detector of claim 6, wherein the at least one cut out portion has sloping portions that slope toward the aperture of the at least one cut out portion.

11. A point heat detector of a fire sensing system, comprising:
a detector housing;
a circuit board body having number of corners; and
a surface mounted thermistor mounted on at least one corner;
wherein the circuit board body has an edge at its periphery and wherein the surface mounted thermistor is positioned on the corner having the aperture proximate thereto and positioned between the edge and the at least one aperture; and
a controller and memory, the memory having instructions executable by the controller to:
collect data from the surface mounted thermistor mounted on at least one corner.

12. The point heat detector of claim 11, wherein the controller analyzes a time value that the data was received to determine a direction of a heat source.

13. The point heat detector of claim 11, wherein the point heat detector has surface mounted thermistors mounted on at least two corners and wherein the controller compares data received from the thermistors mounted on the at least two corners to determine a direction of a heat source.

14. The point heat detector of claim 11, wherein the point heat detector has surface mounted thermistors mounted on at least two corners and wherein the controller combines data received from the thermistors mounted on the at least two corners to determine a direction of a heat source.

15. The point heat detector of claim 11, wherein the point heat detector includes a digital compass and has surface mounted thermistors mounted on at least two corners and wherein the controller combines data received from the thermistors mounted on the at least two corners and the digital compass to determine a direction of a heat source.

16. The point heat detector of claim 11, wherein the controller compares a measured thermistor temperature with an estimated thermistor temperature to determine a model thermistor temperature.

17. The point heat detector of claim 11, wherein the controller determines a difference value by comparing a measured thermistor temperature with an estimated thermistor temperature.

18. The point heat detector of claim 17, wherein the controller uses the difference value to update a sensor model.

19. The point heat detector of claim 17, wherein the controller uses the difference value to update an air flow temperature estimating model.

* * * * *